United States Patent
Watanabe et al.

(10) Patent No.: US 10,896,970 B2
(45) Date of Patent: Jan. 19, 2021

(54) PROCESS OF FORMING HIGH ELECTRON MOBILITY TRANSISTOR (HEMT) AND HEMT FORMED BY THE SAME

(71) Applicant: SUMITOMO ELECTRIC DEVICE INNOVATIONS, INC., Kanagawa (JP)

(72) Inventors: Tadashi Watanabe, Yokohama (JP); Hajime Matsuda, Yokohama (JP)

(73) Assignee: SUMITOMO ELECTRIC DEVICE INNOVATIONS, INC., Kanagawa (JP)

(*) Notice: Subject to any disclaimer, the term of this patent is extended or adjusted under 35 U.S.C. 154(b) by 0 days.

(21) Appl. No.: 16/849,836

(22) Filed: Apr. 15, 2020

(65) Prior Publication Data

US 2020/0312982 A1  Oct. 1, 2020

Related U.S. Application Data

(62) Division of application No. 16/127,896, filed on Sep. 11, 2018, now Pat. No. 10,686,053.

(30) Foreign Application Priority Data

Sep. 12, 2017 (JP) .................................. 2017-174973

(51) Int. Cl.
*H01L 29/66* (2006.01)
*H01L 21/02* (2006.01)
(Continued)

(52) U.S. Cl.
CPC .... *H01L 29/66462* (2013.01); *H01L 21/0217* (2013.01); *H01L 21/02164* (2013.01);
(Continued)

(58) Field of Classification Search
CPC ......... H01L 21/02274; H01L 21/32131; H01L 21/31116; H01L 21/02271;
(Continued)

(56) References Cited

U.S. PATENT DOCUMENTS 5,686,325 A    11/1997  Moriuchi et al.
2005/0139870 A1  6/2005  Hikita et al.
(Continued)

FOREIGN PATENT DOCUMENTS

| JP | 07-086310 | 3/1995 |
| JP | 08-162476 | 6/1996 |
| JP | 09-312299 | 12/1997 |

*Primary Examiner* — Stephen M Bradley
*Assistant Examiner* — Wasiul Haider
(74) *Attorney, Agent, or Firm* — Smith, Gambrell & Russell, LLP.

(57) ABSTRACT

A process of forming a field effect transistor (FET) of a type of high electron mobility transistor (HEMT) reducing damages caused in a semiconductor layer is disclosed. The process carries out steps of: (a) depositing an insulating film on a semiconductor stack; (b) depositing a conductive film on the insulating film; (c) forming an opening in the conductive film and the insulating film by a dry-etching using ions of reactive gas to expose a surface of the semiconductor stack; and (d) forming a gate electrode to be in contact with the surface of the semiconductor stack through the opening, the gate electrode filling the opening in the conductive film and the insulating film.

12 Claims, 6 Drawing Sheets

(51) Int. Cl.
*H01L 21/3213* (2006.01)
*H01L 21/285* (2006.01)
*H01L 29/47* (2006.01)
*H01L 21/311* (2006.01)
*H01L 29/20* (2006.01)
*H01L 29/778* (2006.01)
H01L 29/423 (2006.01)

(52) U.S. Cl.
CPC .. *H01L 21/02271* (2013.01); *H01L 21/02274* (2013.01); *H01L 21/28581* (2013.01); *H01L 21/28587* (2013.01); *H01L 21/31116* (2013.01); *H01L 21/31144* (2013.01); *H01L 21/32131* (2013.01); *H01L 21/32137* (2013.01); *H01L 29/20* (2013.01); *H01L 29/475* (2013.01); *H01L 29/7785* (2013.01); H01L 29/42316 (2013.01)

(58) Field of Classification Search
CPC ......... H01L 21/28581; H01L 21/28587; H01L 21/32137; H01L 21/0217; H01L 21/02164; H01L 21/31144
See application file for complete search history.

(56) References Cited

U.S. PATENT DOCUMENTS

| | | |
|---|---|---|
| 2010/0127275 A1 | 5/2010 | Takehiko et al. |
| 2010/0244178 A1* | 9/2010 | Huang ................ H01L 29/8128 257/472 |
| 2016/0372588 A1* | 12/2016 | Mizuno ............. H01L 29/66462 |
| 2017/0330880 A1 | 11/2017 | Takeuchi |

* cited by examiner

PROCESS OF FORMING HIGH ELECTRON MOBILITY TRANSISTOR (HEMT) AND HEMT FORMED BY THE SAME

CROSS REFERENCE TO RELATED APPLICATION

The present application is a division of U.S. application Ser. No. 16/127,896 filed on Sep. 11, 2018 and claims priority therefrom under 35 U.S.C. § 120. application Ser. No. 16/127,896 is based on and claims the benefit of priority of Japanese Patent Application No. 2017-174973, filed on Sep. 12, 2017, the entire content of which is incorporated herein by reference.

BACKGROUND OF INVENTION

1. Field of Invention

The present invention relates to a process of forming a high electron mobility transistor (HEMT), in particular, a process of a HEMT primarily made of nitride semiconductor materials and a HEMT formed thereby.

2. Background Arts

A Japanese Patent Application laid open No. JP-H07-086310A has disclosed a process of forming a gate electrode of a field effect transistor (FET). The process disclosed therein sequentially deposits, on a silicon oxide layer, a layer made of tungsten silicon nitride (WSiN), a metal intermediate layer, and a layer made of gold (Au). Thereafter, the metal intermediate layer and the WSiN layer are processed in a designed shape; then, an exposed Au layer is removed with solvent, and covers with a protection film made of material not causing reductive reaction for an etchant of hydrofluoric acid. Etching the silicon oxide film, a solvent may remove the protection film.

Another Japanese Patent Application laid open No. JP-H08-162476A has disclosed another process of forming a semiconductor device. The process disclosed therein forms a first insulating film only under overhangs of a T-shaped gate electrode, then, covers the T-shaped gate electrode and semiconductor layers with a second insulating film that may adjust stresses and resultantly a threshold voltage of the semiconductor device.

A process of forming a gate electrode generally provides steps of: first forming an opening in an insulating film that covers a semiconductor layer, then forming a gate electrode such that the gate electrode is in contact with the semiconductor layer through the opening to make a Schottky contact thereto. The formation of the opening in the insulating film is generally carried out by dry-etching, for instance, a reactive ion etching (RIE) using ionized plasma ions. Ionized ions in RIE may react with atoms contained in a material to be etched, then, vaporize reacted compounds. However, the material to be etched is usually charged by plasma ions and sometimes electrons. Ions and/or electrons accumulated in the material to be etched discharge to the semiconductor material in an instant when the etching process exposes the surface of the semiconductor layer. Such discharged electrons may often degrade, or sometimes destroy structures formed within the semiconductor layer. A technique to prevent the degradation or destruction of the semiconductor structures during the dry etching has been requested in the field.

SUMMARY OF INVENTION

One aspect of the present invention relates to a process of forming a field effect transistor (FET) of a type of high electron mobility transistor (HEMT). The process comprises steps of: (a) depositing an insulating film on a semiconductor stack; (b) deposing a conductive film on the insulating film; (c) forming an opening in the conductive film and the insulating film y a dry-etching using ions of reactive gas to exposes a surface of the semiconductor stack b; and (d) forming a gate electrode to be in contact with the surface of the semiconductor stack, the gate electrode filling the opening in the conductive film and the insulating film.

Another aspect of the invention relates a semiconductor device type of high electron mobility transistor (HEMT). The semiconductor device comprises: a semiconductor layer; an insulating film on the semiconductor layer, where the insulating film provides an opening; a gate electrode that is in contact with the semiconductor layer through the opening, where the gate electrode fills the opening and extends in peripheries of the opening; and a conductive film provided between the insulating film and a portion of the gate electrode in the peripheries of the opening. A feature of the semiconductor device of the invention is that the insulating film and the conductive film are made of respective materials containing silicon (Si).

BRIEF DESCRIPTION OF DRAWINGS

The foregoing and other purposes, aspects and advantages will be better understood from the following detailed description of a preferred embodiment of the invention with reference to the drawings, in which.

DESCRIPTION OF EMBODIMENT

Next, embodiment according to the present invention will be described as referring to drawings. However, the present invention is not restricted to the embodiment, and has a scope defined in claims and all modifications and changes within the scope of the claims and equivalents thereto. Also, in the description of the drawings, numerals or symbols same with or similar to each other will refer to elements same with or similar to each other without duplicating explanation.

Figure 1:
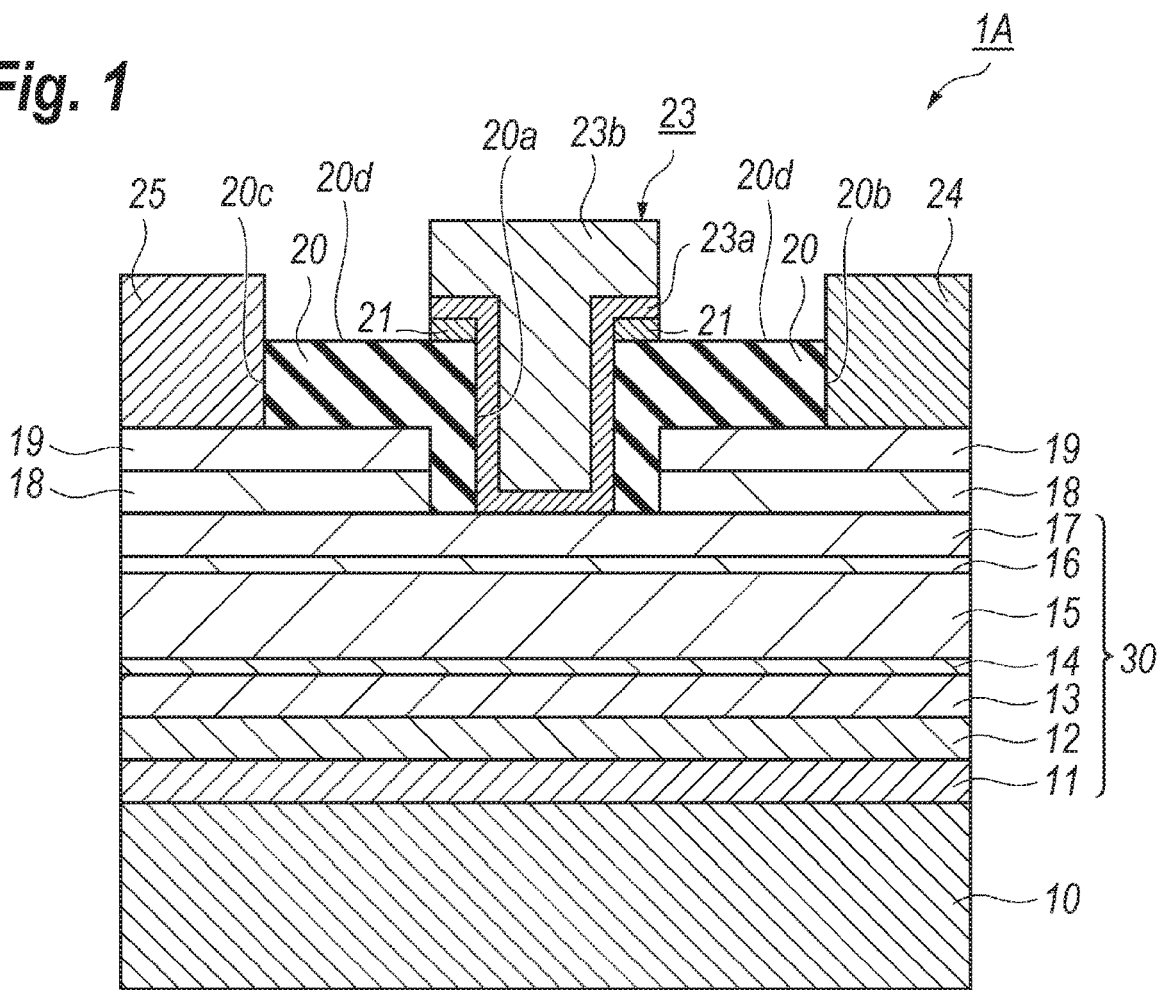
FIG. 1 is a cross sectional view of a high electron mobility transistor (HEMT) formed by a process according to embodiment of the present invention.

FIG. 1 is a cross sectional view of a high electron mobility transistor (HEMT) formed by a process according to embodiment of the present invention. The HEMT 1A of the embodiment includes a substrate 10, a buffer layer 11, a current blocking layer 12, a lower electron supplying layer 13, a channel layer 15, an upper electron supplying layer 17, a cap layer 18, a contact layer 19, an insulating film 20, and electrodes of a gate 23, a drain 24, and a source 25. Thus, the HEMT 1A of the embodiment provides two electron supplying layers, 13 and 17, putting the channel layer 15 therebetween, which is sometimes called a double channel HEMT. The HEMT 1A induces two dimensional electron gases (2DEGs) in the channel layer 15 at an interface against the lower electron supplying layer 13 and against the upper electron supplying layer 17, and these two 2DEGs constitute the double channels in the HEMT 1A. Semiconductor layers from the buffer layer 11 to the upper electron supplying layer 17 form a semiconductor stack 30.

The substrate 10, which is prepared for growing epitaxial layers thereon for the semiconductor stack 30, may be made of gallium arsenide (GaAs) when the semiconductor stack 30 includes materials related to GaAs; while, the substrate 10 may be made of silicon carbide (SiC), sapphire ($Al_2O_3$), and so on when the semiconductor stack 30 includes nitride semiconductor materials. The present embodiment takes the substrate 10 made of GaAs because the semiconductor stack 30 comprises GaAs related materials.

The buffer layer 11, which is epitaxially grown on the substrate 10, may enhance crystal quality of layers grown thereon. The buffer layer 11 may be made of undoped GaAs with impurity concentration smaller than $1 \times 10^{15}$ cm$^{-3}$ and have a thickness around 10 nm.

The current blocking layer 12, which is epitaxially grown on the buffer layer 11, may suppress carriers from leaking to the substrate 10. The current blocking layer 12 has bandgap energy greater than those of layers sandwiching the current blocking layer 12, namely, the buffer layer 11 and the lower electron supplying layer 13. The present embodiment provides the current blocking layer 12 made of n-type aluminum gallium arsenide (AlGaAs), exactly, n-type $Al_{0.28}Ga_{0.72}As$, with a thickness around 10 nm and impurity concentration of $1 \times 10^{17}$ cm$^{-3}$.

The lower electron supplying layer 13, which is also epitaxially grown on the current blocking layer 12, may supply carriers, namely, electrons into the channel layer 15. The lower electron supplying layer 13 has electron affinity smaller than that of the channel layer 15, where the present embodiment includes the lower electron supplying layer 13 made of n-type AlGaAs with a thickness around 11 nm and impurity concentration around $2.5 \times 10^{18}$ cm$^{-3}$. The electron affinity means energy for extracting one electron existing in the conduction band to a vacuum, namely, enough apart from the semiconductor material.

The channel layer 15, which is epitaxially grown on the lower electron supplying layer 13, may induce the 2DEG at an interface against the lower electron supplying layer 13, where the 2DEG becomes one of the channels in the HEMT 1A. The channel layer 15 of the present embodiment is made of undoped indium gallium arsenide (InGaAs) with impurity concentration smaller than $1 \times 10^{15}$ cm$^{-3}$; but in an alternative, the channel layer 15 may include impurities. The channel layer 15 of the present embodiment has a thickness around 14 nm.

The upper electron supplying layer 17, which is epitaxially grown on the channel layer 15, may supply carries, namely, electrons into the channel layer 15. The upper electron supplying layer 17 may be also made of material having the electron affinity smaller than that of the channel layer 15, where the present embodiment provides the upper electron supplying layer 17 made of n-type AlGaAs, exactly, n-$Al_{0.25}Ga_{0.75}As$, with a thickness around 11 nm and impurity concentration around $2.5 \times 10^{18}$ cm$^{-3}$.

In an alternative, the HEMT 1A may provide spacer layers, 14 and 16, between the lower electron supplying layer 13 and the channel layer 15, and between the channel layer 15 and the upper electron supplying layer 17. Those spacer layers, 14 and 16, may spatially separate the carriers in the channels of the channel layer 15 from the impurities contained in the lower electron supplying layer 13 and the upper electron supplying layer 17. The spacer layers, 14 and 16, may be made of undoped AlGaAs, exactly $Al_{0.25}Ga_{0.75}As$, with impurity concentration smaller than $1 \times 10^{16}$ cm$^{-3}$.

The cap layer 18, which is epitaxially grown on the upper electron supplying layer 17, may be made of n-type AlGaAs with a thickness around 10 nm and impurity concentration around $1.0 \times 10^{17}$ cm$^{-3}$. The contact layer 19, which is epitaxially grown on the cap layer 18, may be made of n-type GaAs. The cap layer 18 and the contact layer 19 are interposed between the semiconductor stack 30 and the electrodes of the source 25 and the drain 24; but no cap layer and no contact layer are provided between the gate electrode 23 and the semiconductor stack 30.

The insulating film 20, which may be made of inorganic material containing silicon (Si), covers the contact layer 19 and the semiconductor stack 30 exposed from the contact layer 19. The present embodiment provides dual films of silicon nitride (SiN) and silicon oxide ($SiO_2$) as the insulating film 20, where the SiN film is in contact with the semiconductor stack 30 and the contact layer 19, while, the $SiO_2$ film is provided on the SiN film. The SiN film of the embodiment has a thickness around 32 nm, for instance, 30±5 nm, while, the $SiO_2$ film provided on the SiN film has a thickness around 300 nm, specifically, 300±30 nm. In an alternative, the insulating film 20 may be a mono film made of SiN or $SiO_2$. Still another alternative, the insulating film 20 may include silicon oxy-nitride (SiON), or may be made of mono SiON film.

The insulating film 20 provides openings, 20a to 20c, specifically, an opening 20a for the gate electrode 23, an opening 20b for the drain electrode 24, and an opening 20C for the source electrode 25. The gate opening 20a exposes the top of the semiconductor stack 30, exactly, the top of the upper electron supplying layer 17 in the present embodiment; while, the drain opening 20b and the source opening 20c expose the top of the contact layer 19.

The drain electrode 24 and the source electrode 25, which are non-rectifier contacts with respect to the semiconductor stack 30, may be in contact with the top of the contact layer 9 through the drain opening 20b and the source opening 20C. The drain electrode 24 and the source electrode 25 may be formed by alloying stacked metals of eutectic metal of AuGe and nickel Ni.

The gate electrode 23 is in contact with the upper electron supplying layer 17 through the gate opening 20a in a length of 0.4 µm, which corresponds to the gate length. The gate length becomes identical with a width of the gate opening 20a in the insulating film along a direction connecting the drain electrode 24 with the source electrode 25. Also, the gate electrode 23 extends on the insulating film 20 in peripheries of the gate opening 20a so as to form a T-shaped cross section.

The gate electrode 23 has stacked metals of a Schottky metal 23a and gold (Au) 23b as a cover metal, where the Schottky metal 23a is in contact with the upper electron supplying layer 17. The present embodiment provides the Schottky metal 23a made of tungsten silicide (WSi) that extends on the upper electron supplying layer 17, sides of the gate opening 20a, and a top god of the insulating film 20 in peripheries of the gate opening 20a. The Schottky metal 23a has a thickness far thinner than that of cover metal 23b; specifically, the present embodiment provides the Schottky metal 23a made of WSi with a thickness around 30 nm, specifically 30±5 nm. The Au layer 23a on the Schottky metal 23h decreases resistivity of the gate electrode 23.

The gate electrode 23, as described above, has the T-shaped cross section includes a portion within the gate opening 20a and another portion provided on the insulating film 20 around the gate opening 20a, where the latter portion extends toward the drain electrode 24 and the source electrode 25 and forms overhangs with respect to the former portion. A feature of the HEMT 1A of the present embodiment is that the overhangs in the gate electrode 23 interpose a conductive film 21 against the top god of the insulating film 20. The conductive film 21, which is in contact with the insulating film 20, is a residue left during the formation of the gate electrode 23 and may be made of inorganic material containing silicon (Si), preferably, same with that of the Schottky metal 23a and a thickness of also that of the Schottky metal 23a or thinner, specifically, 20±5 nm. When the conductive film 21 is made of material same with that of the Schottky metal 23a; the process of forming the gate electrode 23 may be simplified.

Next, a process of forming the HEMT 1A will be described as referring to FIG. 2 to FIG. 3, where those drawings are cross sectional views of the HEMT 1A at respective steps of the process.

Figure 2A:
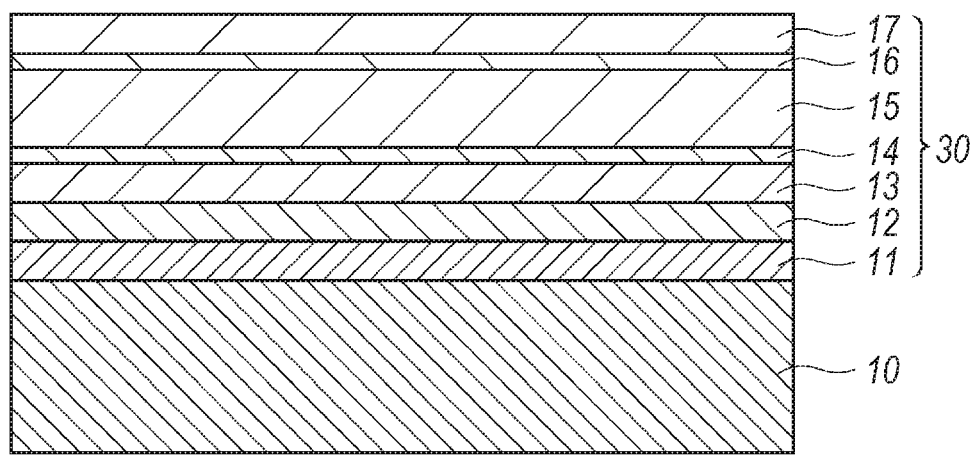
FIG. 2A to FIG. 2C are cross sectional views of the HEMT at respective steps of the process of forming the HEMT.

First, as shown in FIG. 2A, an epitaxial substrate including a semiconductor stack 30 on the substrate 10 is prepared. The semiconductor stack 30 including the buffer layer 11, the current block layer 12, the lower electron supplying layer 12, the lower spacer layer 14, the channel layer, the upper spacer layer 16, and the upper electron supplying layer 17, where those layers may be grown by, for instance, a metal organic chemical vapor deposition (MOCVD) technique. Those layers may be made of undoped GaAs, n-type AlGaAs, undoped AlGaAs, undoped InGaAs, undoped AlGaAs, and n-type AlGaAs, respectively, from the buffer layer 11 to the upper electron supplying layer 16. The substrate 10 maybe made of GaAs, exactly, made of semi-insulating GaAs.

Figure 2B:
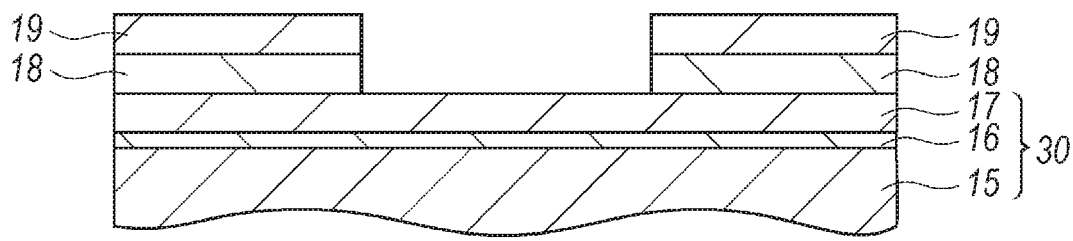

Thereafter, as shown in FIG. 2B, a selective epitaxial growth may form the cap layer 18 and the contact layer 19; specifically, preparing a mask that covers an area corresponding to a gate region, the selective growth of the cap layer 18 and the contact layer 19 is sequentially carried out in respective sides of the mask. The contact layer 18 may be made of n-type AlGaAs; while, the contact layer 19 may be made of n-type GaAs.

Figure 2C:
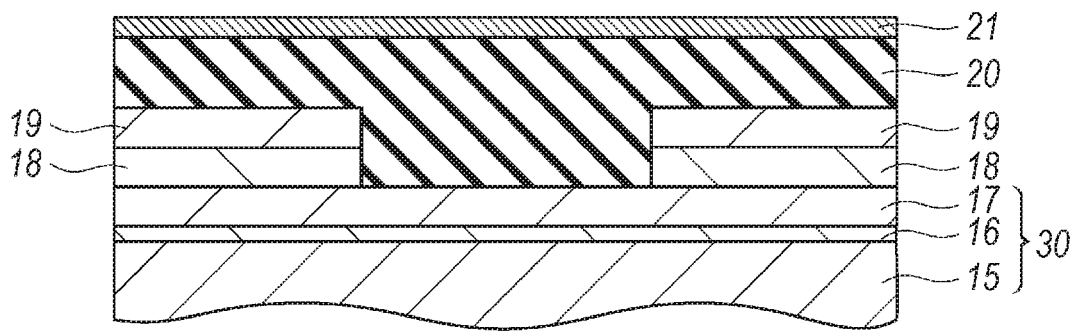

Thereafter, as shown in FIG. 2C, the semiconductor stack 30, the cap layer 18, and the contact layer 19 are covered with an insulating film 20, which may be made of silicon nitride (SiN), formed by, for instance, plasma assisted chemical vapor deposition (p-CVD) technique. Conditions of the p-CVD are, a substrate temperature of 300° C., and source gases for Si and N are mono silane ($SiH_4$) and ammonia ($NH_3$), respectively. Thereafter, another insulating film, which may be made of silicon oxide ($SiO_2$), is deposited on the aforementioned insulating film 20, by a process of, for instance, ordinary pressure chemical vapor deposition (o-CVD). That is, the insulating film 20 of the present embodiment has a dual-layer arrangement. The process of the embodiment further deposit, on the insulating film 20, an electrically conductive film 21 that contains silicon (Si) such as tungsten silicide (WSi) by the metal sputtering and a thickness of 20 nm.

Thereafter, the process exposes the contact layer 19 by forming openings in the insulating film 20 and the electrically conductive film 21, and deposits metals on the contact layer 19 exposed in the openings for electrodes of the drain layer 24 and the source 25, respectively. The metals are eutectic alloy of gold and germanium (AuGe) and nickel (Ni) stacked on AuGe. After the metal deposition, the process carries out alloying the deposited metals to form non-rectifier contact against the contact layer 19.

Figure 3A:
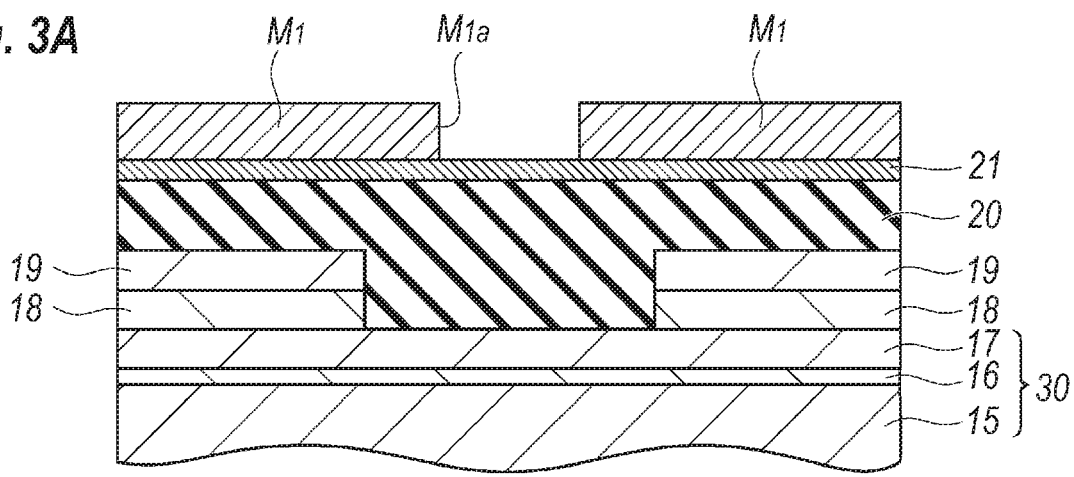
FIG. 3A to FIG. 3C are cross sectional views of the HEMT at respective steps of the process subsequent to the step shown in FIG. 2C.

Thereafter, as shown in FIG. 3A, a patterned photoresist M1 is formed on the electrically conductive film 21, where the patterned photoresist M1 provides an opening Mia in an area where the gate electrode 23 is to be formed. The patterned photoresist M1 is first coated by a thickness of around 1 μm, then illuminated with ultraviolet rays, and finally developed to form the opening M1a.

Figure 3B:
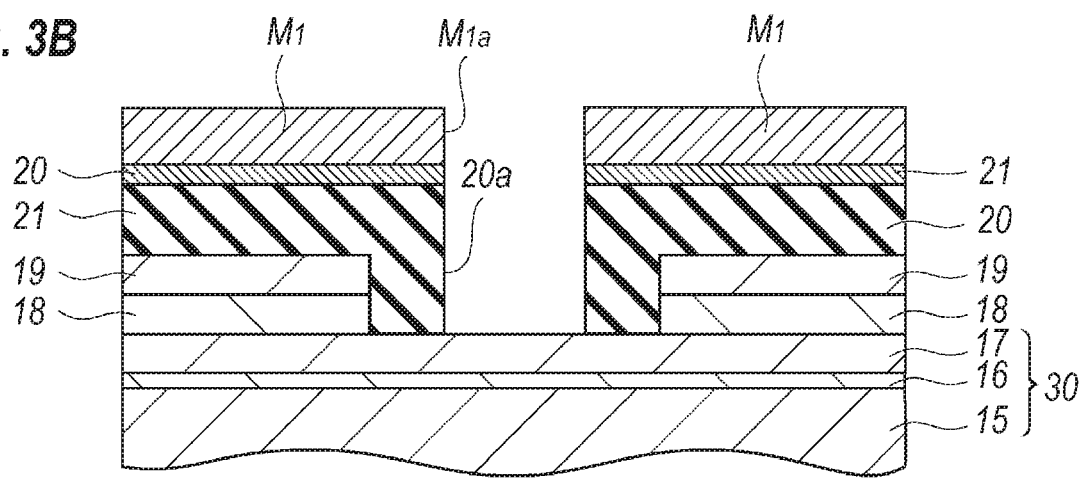

Thereafter, as shown in FIG. 3B, the electrically conductive film 21 and the insulating film 20 may be etched using the patterned photoresist M1 as an etching mask to form the opening 20a in the respective films, 21 and 20. That is, the opening 20a pierces the films, 21 and 20, to expose the top of the semiconductor stack 30. A dry-etching typically a reactive ion etching (RIE) with the inductively coupled plasma (ICP-RIE) may be applicable to etch the films, 21 and 20, using a reactive gas containing fluorine (F), such as a mixture of sulfur hexafluoride ($SF_6$) and tri-fluoro-methane ($CHF_3$). Flow rates of both gas sources are, for instance, 9 sccm and 40 sccm, where a unit sccm means on cubic centimeters at 0° C. and 1 atmosphere for one minute. The pressure during the etching is, for instance, 4 mTorr (=0.533 Pa), and the RF power is 15 W. When both films, 21 and 20, are inorganic films containing Si, a reactive gas containing fluorine (F) may etch both films concurrently. The RIE may use only one of $SF_6$ and $CHF_3$, or another gas, for instance, carbon tetrafluoride ($CF_4$).

Figure 3C:
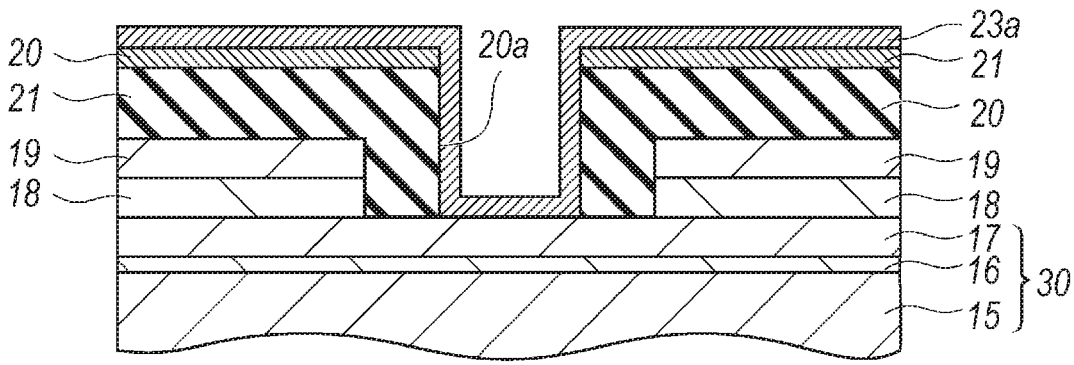
Figure 4A:
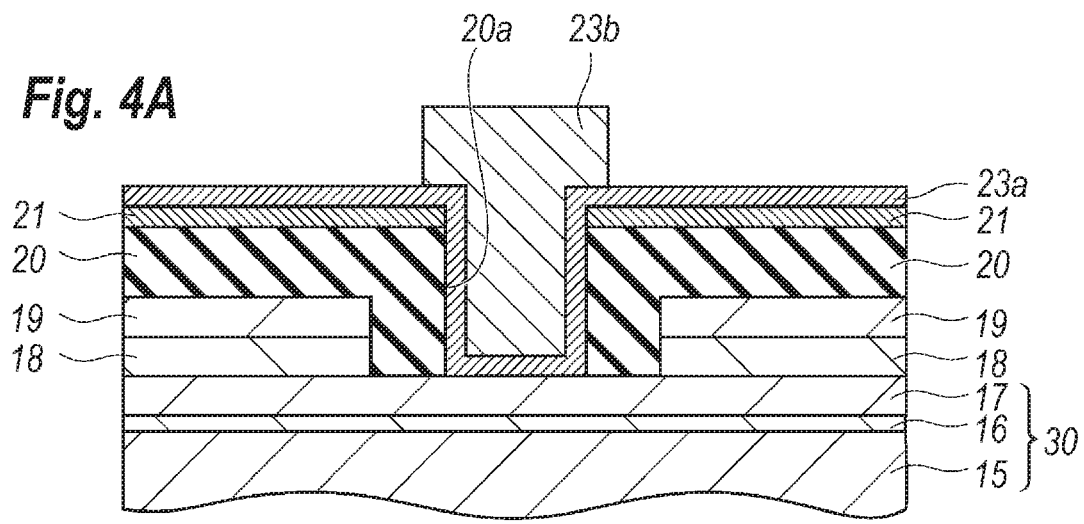
FIG. 4A and FIG. 4B are cross sectional views of the HEMT at respective steps of the process subsequent to the step shown in FIG. 3C.

Thereafter, the process form the gate metal 23. Specifically, as shown in FIG. 3C, the process first deposits a metal 23a making a Schottky contact against the upper electron supplying layer 17 by a metal sputtering. Then, another metal 23b made of gold (Au) covers the Schottky metal 23a so as to fill the opening 20a, as shown in FIG. 4A. Specifically, preparing a patterned photoresist on the Schottky metal 23a, where the patterned photoresist provides an opening that determines dimensions of top portions of the gate electrode 23, then plating gold (Au) selectively within the opening in the patterned photoresist using the Schottky metal 23a as one of electrodes for the selective electrolytic plating, the gate electrode 23 with the T-shaped cross section shown in FIG. 4A and FIG. 4B may be formed. The patterned photoresist is removed after the selective plating.

Figure 4B:
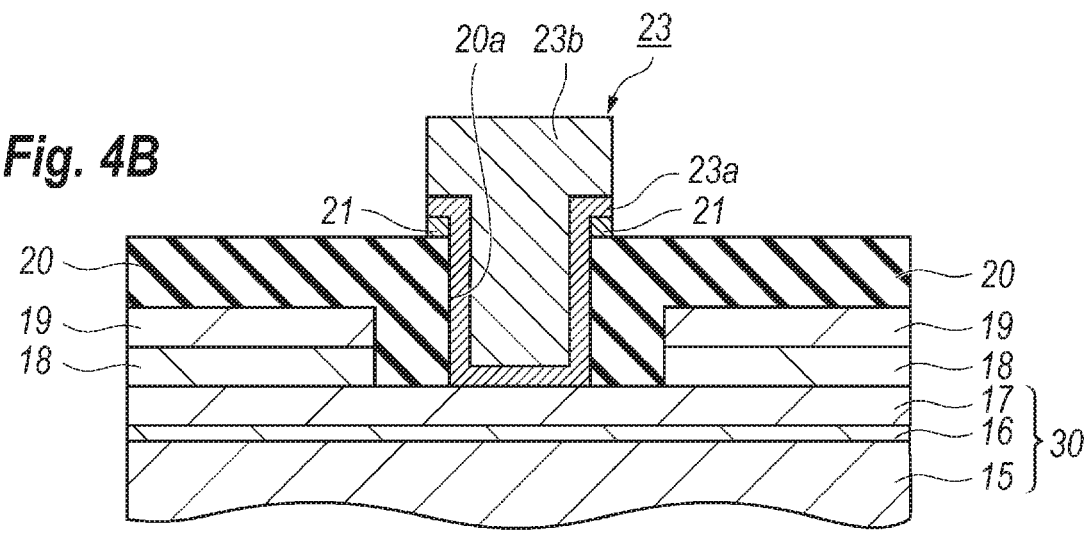

Thereafter, as shown in FIG. 4B, the Schottky metal 23a is removed in a portion exposed from the cover metal 23b by, for instance, ion milling. Moreover, the electrically conductive film 21 is also removed in a portion exposed from the cover metal 23b and the Schottky metal 23a by the ion milling. The ion milling uses argon ions ($Ar^+$). The ion milling scrapes a surface of Au layer 23b; but the Au layer 23b is enough thicker than the Schottky metal 23a and the electrically conductive film 21; accordingly, the Au layer 23b may be left by an enough thickness. Thus, the process of forming the HEMT 1A according to the present embodiment is completed.

Figure 5A:
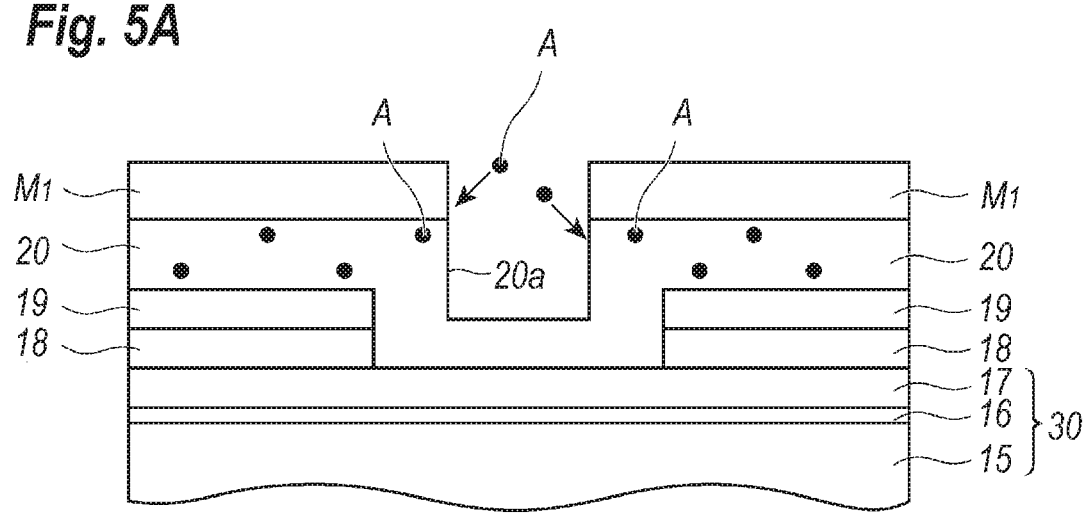
FIG. 5A schematically explains a mechanism to charge an insulating film with ions or electrons, and FIG. 5B schematically explains a mechanism that ions and/or electrons induced during a dry-etching process are discharged through electrically conductive film.

Advantages of the HEMT 1A formed by the process according to the present invention will be described. A conventional process of forming a HEMT accumulates charges, namely, ions and electrons, in an insulating film when a dry-etching such as a reactive ion etching (RIE) forms an opening 20a therein. A charged insulating film 20 may discharge ions and electrons A into the channel layer causing damages in the electron supplying layer 17 at an instant when the etching exposes the surface of the semiconductor stack 30, as shown in FIG. 5A. In particular, the opening 20a formed in the insulating film 20 for the gate electrode 23 becomes minute year after year to remarkably enhance charge density within the opening 20a, which may further cause damages in the semiconductor layers.

Figure 5B:
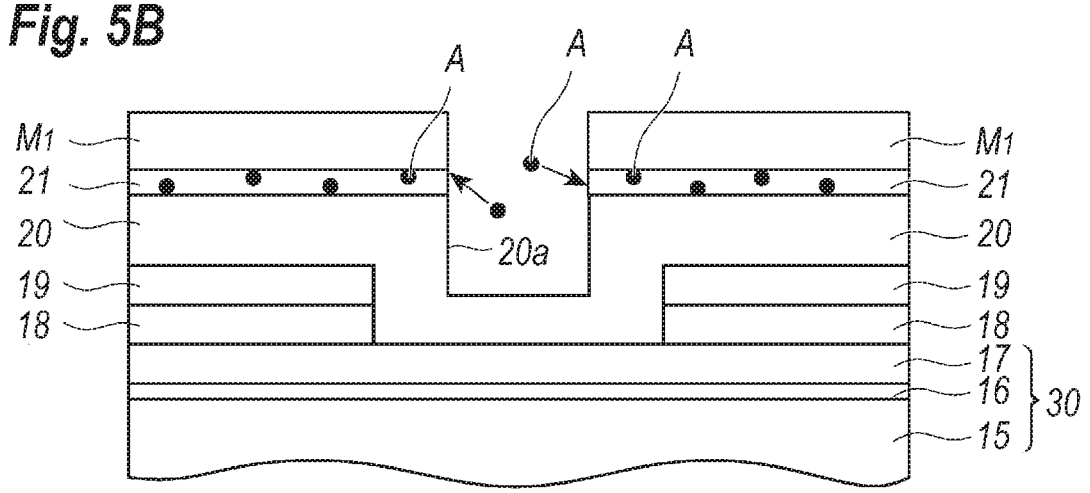

The process according to the present invention deposits the conductive film 21 onto the insulating film 20, then forms the gate opening 20a in the insulating film 20 by the RIE. The ions and electrons A, as shown in FIG. 5B, may be discharged through the conductive film 21 even when the insulating film 20 accumulates the ions and electrons A. Accordingly, the insulating film 20 may be prevented from being charged and the semiconductor layers to be exposed within the gate opening 20a are suppressed to receive damages.

Figure 6A:
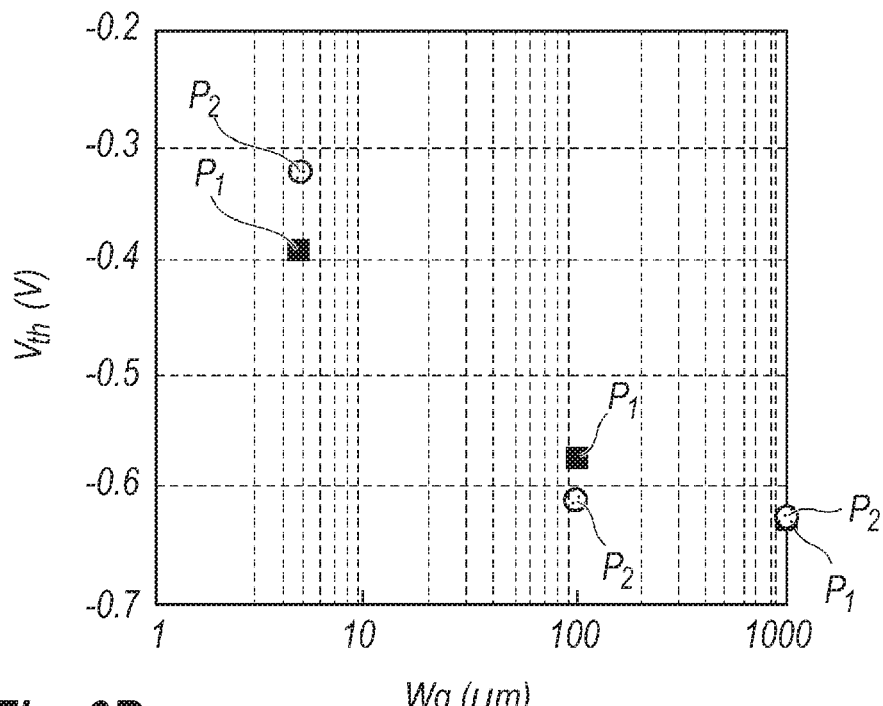
FIG. 6A and FIG. 6B verify effects and advantages of the process according to the present invention.
Figure 6B:
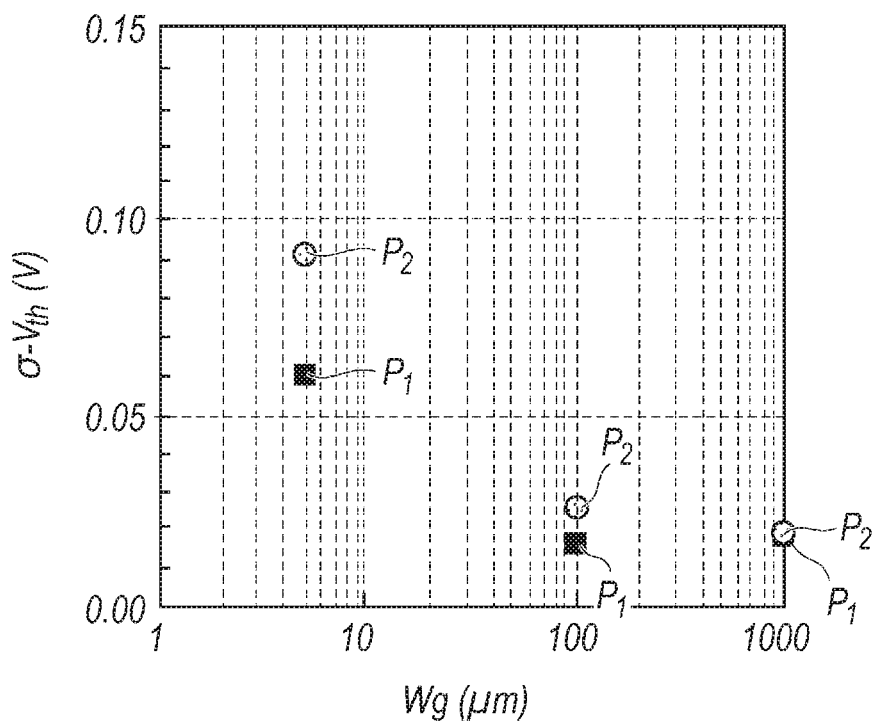

FIG. 6A and FIG. 6B verify effects and advantages of the process according to the present invention, where FIG. 6A shows dependence of a threshold voltage $V_{th}$ of a FET on a gate width $W_g$, while, FIG. 6B show dependence of a dispersion of the threshold voltage $\sigma$-$V_{th}$ also on the gate width $W_g$. In those figures, symbols $P_1$ correspond to results of the present invention, that is, the process forms the gate opening 20a after depositing the conductive film 21, while, symbols $P_2$ show results of the conventional process without forming the conductive film 21. Referring to FIG. 6A and FIG. 6B, the threshold voltage $V_{th}$ becomes smaller but the dispersion thereof $\sigma$-$V_{th}$ is greater as the gate width is narrower, that is, the area of the gate opening 20a becomes smaller. Comparing the two processes by the results, $P_1$ and $P_2$, the present embodiment of the process, resulting in the symbols $P_1$, may reduce the dispersion $\sigma$-$V_{th}$, and this advantage becomes striking as the gate width $W_g$ is smaller.

The conductive film 21 and the insulating film 20 may be made of inorganic material containing Si; then, the etching process of forming the gate opening 20a may use a reaction gas containing fluorine (F). This relation of the films, 20 and 21, and the reaction gas enables the etching process to be continuous and sequential for the films, 20 and 21. The conductive film 21 may be made of WSi, which show relatively greater resistivity compared with other metals but the absolute value thereof is enough smaller than that of the insulating film 20 made of, for instance, SiN, SiO$_2$, and so on.

The insulating film 20 may be made of SiN and in contact with the semiconductor stack 30. The insulating film 20 made of SiN show enough resistivity not only in electrical but also in moisture tolerance to protect the semiconductor stack 30. Moreover, because an SiN in the insulating film 20 does not contain oxygen (O), the insulating film 20 may not cause diffusion of oxygen (O) into the semiconductor stack 30, or the SiN film may become a barrier for diffusion of oxygen (O) from the SiO$_2$ film into the semiconductor stack 30.

The conductive film 21 exposed from the gate electrode 23 may be removed by the ion milling. Because the conductive film 21 in a material thereof is selected by a condition that the reactive gas may etch the conductive film 21 and the insulating film 20 continuously and sequentially. This condition show reverse effect when a residual conductive film 21 exposed from the gate electrode 23 is to be removed. The ion milling may selectively remove the residual conductive film 21. The ion milling using argon ions (Ar+) probably charges the insulating film 20. However, because the ion milling is carried out after the formation of the gate electrode 23, the charges probably accumulated in the insulating film 20 may be discharged through the gate electrode 23 and not induce damages in the semiconductor stack 30.

The gate electrode of the present embodiment has stacked metals of WSi 23a and Au 23b, where the former metal WSi 23a, which may be formed by sputtering, operates as a Schottky contact against the semiconductor stack 30, while, the latter metal Au 23b may be formed by the electrolytic plating using the former metal WSi as a seed electrode. A tungsten silicide (WSi) may form a good Schottky contact showing a higher barrier height against GaAs and AlGaAs that is a material for the upper electron supplying layer 17 of the present embodiment.

The process of forming a HEMT is not restricted to the embodiment thus described, and various modifications and changes may be apparent for an ordinary artisan in the field of the semiconductor process, in particular, the process for compound semiconductor materials. For instance, the embodiment concentrates on a HEMT with a duplicating channel structure. The process may be applicable to an ordinary HEMT with a single channel, or, what is called, a reversed channel structure. Also, the embodiment concentrates on, as materials, GaAs and relating thereto. However, the process of the present embodiment may be applicable to other materials, such as gallium nitride (GaN) and so on.

Also, the embodiment concentrates on the conductive film 21 made of WSi; but the conductive film may be made of other materials, such as pure tantalum (Ta), pure tungsten (W), and so on. A reactive gas containing fluorine (F), such as sulfur hexafluoride (SF$_6$) may also effectively etch Ta and W. An SF$_6$ etches the conductive film 21 then another gas of SF$_6$ mixed with a tri-fluoro-methane (CHF$_3$) may effectively etch the insulating film 20. Accordingly, the appended claims are intended to encompass all such modifications and changes as falling within the true spirit and scope of this invention.

What is claimed is:

1. A process of forming a field effect transistor (FET) of a type of high electron mobility transistor (HEMT), comprising steps of:
   depositing an insulating film on a semiconductor stack;
   depositing a conductive film on the insulating film;
   forming an opening in the conductive film and the insulating film by a dry-etching using ions of reactive gas to expose a surface of the semiconductor stack; and
   forming a gate electrode to be in contact with the surface of the semiconductor stack through the opening, the gate electrode filling the opening in the conductive film and the insulating film.

2. The process according to claim 1,
   wherein the steps of depositing the insulating film and the conductive film form the insulating film and the conductive film each containing silicon (Si); and
   wherein the reactive gas contains fluorine (F).

3. The process according to claim 2,
   wherein the step of forming the gate electrode includes steps of:
   sputtering a Schottky metal on the surface of the semiconductor stack, a side surface of the opening in the conductive film and the insulating film, and on the conductive film outside of the opening, plating a gold (Au) film in a portion of the Schottky metal within the opening and peripheries of the opening, and removing another portion of the Schottky metal and the conductive film exposed from the Au film.

4. The process according to claim 3, wherein the step of depositing the conductive film forms the conductive film with a thickness smaller than a thickness of the Schottky metal.

5. The process according to claim 4, wherein the step of Sputtering the Schottky metal forms the Schottky metal with a thickness of 30±5 nm.

6. The process according to claim 4, wherein the step of depositing the conductive film forms the conductive film with at thickness of 20±5 nm.

7. The process according to claim 3, wherein the step of sputtering forms the Schottky metal made of material same with material of the conductive film.

8. The process according to claim 7, wherein the conductive film and the Schottky metal are made of tungsten silicide (WSi).

9. The process according to claim 1, wherein the step of forming the gate electrode includes a step of removing a portion of the conductive film exposed from the gate electrode by an ion milling.

10. The process according to claim 1, wherein the step of depositing the insulating film sequentially forms the insulating film with dual films of silicon nitride (SiN) and silicon oxide ($SiO_2$) on the SiN film, the SiN film being in contact with the semiconductor stack.

11. The process according to claim 10, wherein the SiN film and $SiO_2$ film have thicknesses of 30±5 nm and 300±30 nm, respectively.

12. The process according to claim 11, wherein the step of depositing the insulating film forms the SiN film by a plasma assisted chemical vapor deposition (p-CVD) technique at 300° C., and the $SiO_2$ film by an ordinary pressure chemical vapor deposition (o-CVD) technique.

* * * * *